(12) United States Patent
Faller et al.

(10) Patent No.: US 8,754,437 B2
(45) Date of Patent: Jun. 17, 2014

(54) LED MODULE HAVING A HEAT SINK

(75) Inventors: Alexander Faller, Dachau (DE); Moritz Kaiser, Munich (DE); Martin Reuter, Munich (DE)

(73) Assignee: OSRAM Gesellschaft mit beschraenkter Haftung, Munich (DE)

( * ) Notice: Subject to any disclaimer, the term of this patent is extended or adjusted under 35 U.S.C. 154(b) by 656 days.

(21) Appl. No.: 12/456,205

(22) Filed: Jun. 12, 2009

(65) Prior Publication Data
US 2010/0001294 A1 Jan. 7, 2010

(30) Foreign Application Priority Data
Jul. 4, 2008 (DE) .......................... 10 2008 031 786

(51) Int. Cl.
*H01L 33/00* (2010.01)

(52) U.S. Cl.
USPC ............. 257/99; 257/625; 257/675; 257/714; 257/706; 257/E33.075

(58) Field of Classification Search
USPC .............. 313/22; 257/99, 625, 675, 706, 714, 257/E33.075
See application file for complete search history.

(56) References Cited

U.S. PATENT DOCUMENTS

| 7,157,838 B2 | 1/2007 | Thielemans et al. | |
|---|---|---|---|
| 2004/0135482 A1* | 7/2004 | Thielemans et al. | 313/22 |
| 2006/0246324 A1* | 11/2006 | Deng et al. | 428/831.2 |
| 2007/0278664 A1* | 12/2007 | Carney et al. | 257/706 |
| 2009/0166850 A1* | 7/2009 | Jeon et al. | 257/706 |

FOREIGN PATENT DOCUMENTS

| DE | 10 2005 057 524 A1 | 7/2006 |
|---|---|---|
| DE | 20 2006 019 381 U1 | 12/2006 |
| DE | 10 2006 016 529 A1 | 10/2007 |
| EP | 1 890 332 A2 | 7/2007 |

* cited by examiner

Primary Examiner — Dale E Page
(74) Attorney, Agent, or Firm — Holtz Holtz Goodman & Chick PC

(57) ABSTRACT

The invention relates to an LED module (1) comprising at least one light-emitting diode (LED) (3) and at least one heat sink (2) for active cooling, having at least one coolant channel (6) through which a cooling fluid flows.
The dimensions of the at least one coolant channel (6) are selected so that a predominantly laminar flow of the fluid is set up in the at least one coolant channel (5) during operation of the LED module (1).

19 Claims, 2 Drawing Sheets

LED MODULE HAVING A HEAT SINK

The invention relates to an LED module comprising at least one light-emitting diode (LED) and at least one heat sink for active cooling, having at least one coolant channel through which a cooling fluid flows, and to a method for producing such a module.

Owing to their good efficiency and long lifetime, light-emitting diodes are being used increasingly for lighting applications, for example in general-purpose lighting. To this end, they are often arranged on so-called LED modules which may also comprise other components besides the light-emitting diode chip per se and a package possibly enclosing the latter, in particular a carrier component on which electrical leads and other electrical components, which may range for example from simple resistors to complex integrated circuits, are arranged. Often, LED modules also comprise cooling devices which can cool the LEDs, and under certain circumstances also the other electrical components of the module.

Such cooling devices are of particular importance since on the one hand light-emitting diodes can develop a great amount of heat during operation, and on the other hand high temperatures can lead to a reduced efficiency, a shortened lifetime or even destruction of the light-emitting diode.

Various concepts have therefore been developed in order to remove heat from an LED module. Passive heat sinks which dissipate the heat to the ambient air are widely used; in order to increase the surface area and therefore raise the efficiency of the heat sink, it may for example be fitted with cooling fins.

Also known are heat sinks with closed channels that are filled with a fluid, which is intended to remove the heat. In this context, there are passive solutions in which the heated medium is discharged by utilizing convective motion or by evaporating a liquid cooling fluid, as in so-called heat pipes or thermosiphons, as well as systems with active cooling in which the throughput of coolant in the heat sink, and therefore the dissipation of heat, are increased by recirculating the coolant, for example by using pumps.

In the heat sinks according to the prior art, the cooling channels have to date mainly been configured with a view to simple fabrication of the heat sink and providing as large as possible a surface area between the heat sink and the cooling fluid. A disadvantage with this is however the high energy expenditure for circulating the cooling fluid, so that the efficiency of the LED module is reduced. Furthermore, pumps require more installation space according to their power, and the noise level of the overall device comprising the LED module and the coolant circuit is increased.

It is therefore an object of the present invention to provide an LED module comprising at least one light-emitting diode (LED) and at least one heat sink for active cooling, having at least one coolant channel through which a cooling fluid flows, in which the cooling effect is optimized while at the same time minimizing the power consumption for circulating the refrigerants and the generation of noise during operation.

This object is achieved by the characterizing features of claim 1.

Particularly advantageous configurations may be found in the dependent claims.

If the dimensions of the at least one coolant channel are selected so that a predominantly laminar flow of the fluid is set up in the at least one coolant channel during operation of the LED module, the flow resistance will be minimized and at the same time the heat transfer from the heat sink to the cooling medium will be optimized. The absence of detrimental turbulence also means that the noise level of the module is reduced. For the same cooling power as in a module according to the prior art, the throughput of coolant can therefore be reduced, which in turn makes it possible to install a smaller cooling pump with lower power consumption and also reduce the noise level of the pump. The other components, such as feed lines, hoses, connections etc., can also be made more compact and therefore less expensive.

It has been shown that when a conventional coolant is used a laminar flow is set up in the at least one coolant channel, through which a cooling fluid flows, when it has a width of between 100 μm and 400 μm, preferably between 200 μm and 300 μm, so that the advantages associated with the laminar flow are thereby achieved.

It has furthermore been found that the at least one coolant channel, through which a cooling fluid flows, should have a height of between 25 μm and 175 μm, preferably between 50 μm and 120 μm, in order to promote the creation of a laminar flow.

A quantity with which to characterize the flow resistance of a closed coolant channel, which is valid even for nonuniform cross sections, is the so-called hydraulic diameter. This is the ratio of four times the flow cross section to the circumference wetted by the fluid. Channels with the same hydraulic diameter behave identically and, in particular, just like a tube of circular cross section with the same diameter.

It has been shown that a laminar flow occurs in a coolant channel, through which a cooling fluid flows, when it has a hydraulic diameter of between 70 μm and 250 μm.

It is particularly advantageous for the cooling fluid to be a medium that is liquid at room temperature, in particular water. Such media are easy to handle and, particularly in the case of water or mixtures of water with other media, for example additives to prevent corrosion, they offer a high heat capacity and good fluidity at the relevant temperatures during operation.

Arranging the at least one LED directly on the coated or uncoated heat sink leads to a particularly simple and effective structure.

Direct arrangement of the LED on the heat sink in the context of this application is intended to mean that no separate support is arranged between the LED and the heat sink, for example a printed circuit board or other substrate which may be regarded as a separate component or would be capable of carrying and/or handling electrical components without the heat sink. Accordingly, modules in which coatings, films or lacquers are applied between the heat sink and the LED are still to be regarded as modules with direct arrangement of the LED on the heat sink.

In particular, this facilitates particularly good heat transfer from the LED to the heat sink, which is impeded in modules according to the prior art because the light-emitting diodes and optionally other components are applied onto a carrier, for example a printed circuit board or ceramic substrate, which is connected to the heat sink on its other side from the LED, i.e. the heat transfer takes place first from the light-emitting diode onto the support and then into the heat sink.

If at least one layer and/or coating of an electrically insulating material is arranged between the LED and the heat sink, they will be electrically separated from one another. This is advantageous particularly for metal heat sinks since the electrical components arranged on the heat sink, or their terminals, are thereby electrically separated from one another and the heat sink does not induce a voltage which could possibly be transferred to other components of the cooling circuit.

If the heat sink is made entirely of an electrically insulating material, or at least on the side facing the LED, this likewise achieves electrical insulation of the terminals of the LED from one another or from other components on the heat sink and the cooling circuit. The material used may in particular be a ceramic material such as aluminum nitride, although other thermally conductive materials may also be envisaged.

If the electrically insulating layer and/or coating is formed by a metal oxide and/or a ceramic material, this will achieve good electrical insulation as well as good thermal conductivity of the layer. These materials can also be applied well as a coating, for example by thermal spraying or by chemical methods.

It is likewise advantageous for an adhesion promoter layer, preferably containing aluminum and/or nickel, to be arranged between the electrically insulating layer and the heat sink. Such a layer serves to improve the adhesion of the insulating layer on the heat sink, on the one hand because the adhesion promoter layer, which adheres well on the heat sink, provides a defined surface roughness which improves the adhesion of the electrically insulating layer, and on the other hand because the layer also acts as compensation for the thermal mismatch occurring between the electrically insulating layer and the heat sink owing to their different thermal expansion coefficients. Layers which contain aluminum and nickel, preferably with a nickel content of more than 85%, particularly preferably not less than 95%, are particularly suitable for this.

If at least one layer and/or coating of an electrically conductive material is arranged between the LED and the heat sink, it will be possible to provide electrical connections between the components arranged on the heat sink.

Designing the electrically conductive layer and/or coating in the form of at least one conductor track is particularly advantageous since circuits can thus be formed directly on the heat sink.

It is also expedient for at least one solder layer to be arranged between the electrically conductive layer and the LED. This layer may advantageously be used to fasten and electrically contact electrical components, for example the LEDs, on the heat sink, for example by means of a reflow solder method.

An LED module according to the invention is advantageously fabricated by a method in which the surface of the heat sink is roughened in a first step, an adhesion promoter layer is applied onto at least some of the roughened surface in a second step, an electrically insulating layer is applied onto at least some of the adhesion promoter layer in a third step, an electrically conductive layer is applied onto at least some of the electrically insulating layer in a fourth step, and electrical components are applied in a last step.

This sequence of the method steps ensures that an LED module with an advantageous layer structure according to the invention can be fabricated with the least possible outlay, and it also ensures optimal durability and working properties of the LED module.

It is expedient for a solder layer to be applied onto at least some of the electrically conductive layer in a fifth step, since this simplifies the application of components, for example by the reflow solder method.

If the electrical components, in particular light-emitting diodes, are applied by means of a reflow solder process, this will ensure particularly simple and reliable electrical and mechanical connection of the components.

Another advantageous option for applying electrical components, in particular unpackaged LED chips, onto the heat sink consists in adhesively fastening them and contacting them by bonding. Elaborate soldering processes, which thermally stress the components, can thereby be obviated.

It has proven advantageous for at least one of the layers, in particular the adhesion promoter layer and/or the electrically insulating layer and/or the electrically conductive layer and/or the solder layer to be applied by means of a thermal spraying method. Thermal spraying methods, for example flame spraying, high velocity flame spraying, plasma spraying or cold gas spraying, are particularly suitable for applying the required layers since layers of very different materials, which cannot be applied by other methods, for example electrochemical methods, can thereby be applied onto one another, and the properties of the layers can be adjusted in a straightforward way, particularly with regard to surface roughness, porosity and layer thickness.

The solder layer may however also be applied advantageously by electrochemical methods, since in this way metal is deposited on metal.

BRIEF DESCRIPTION OF THE DRAWING(S)

The invention will be explained in more detail below with the aid of an exemplary embodiment(s). In the figure(s):

PREFERRED EMBODIMENT OF THE INVENTION

Figure 1:
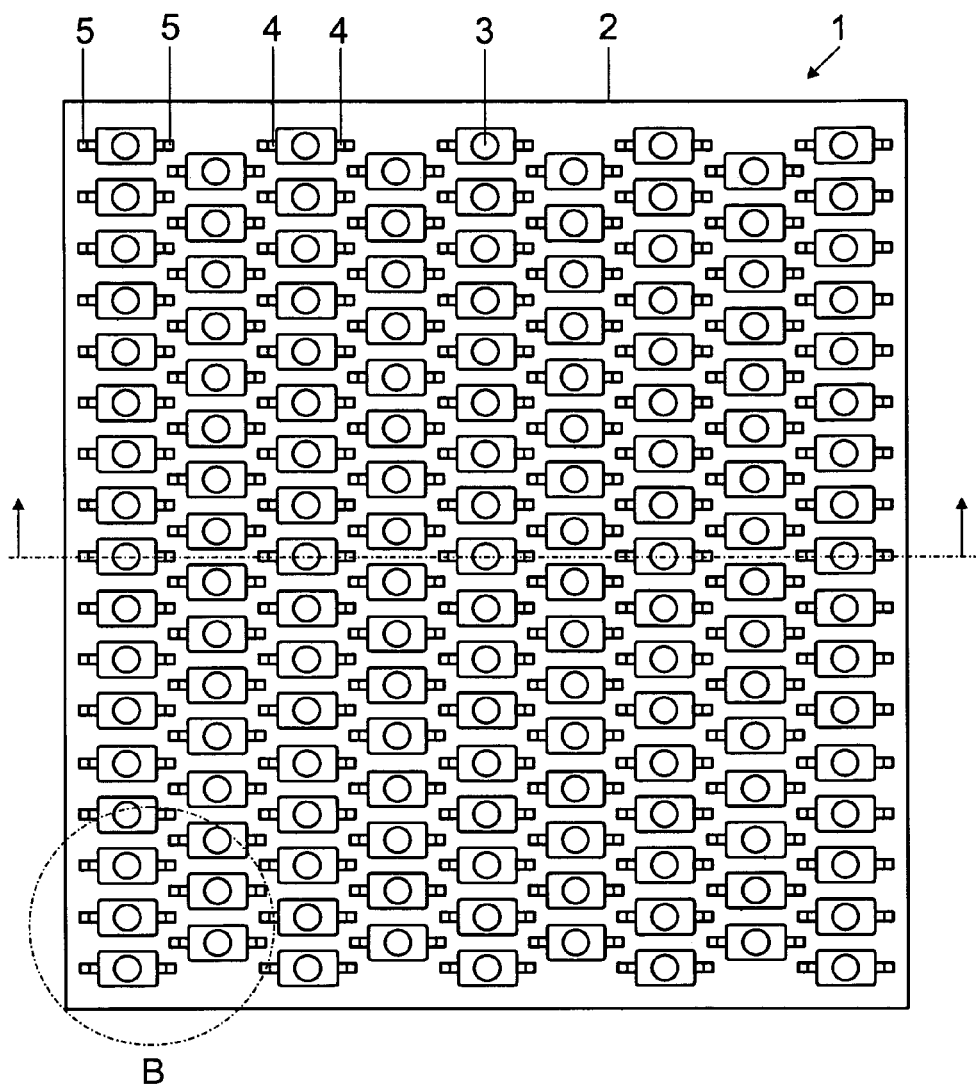
FIG. 1 shows an LED module according to the invention in plan view.
Figure 2:
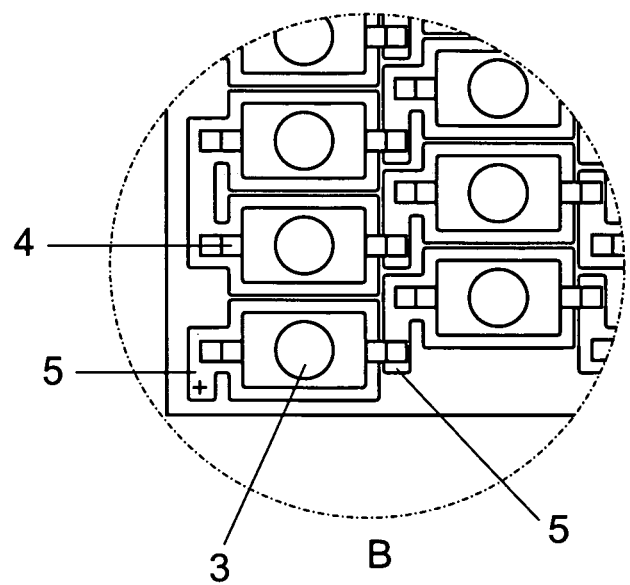
FIG. 2 shows a detail representation of an LED module according to the invention in plan view.

FIG. 1 shows an LED module 1 according to the invention in plan view. A multiplicity of light-emitting diodes 3 (LEDs) are arranged on a square heat sink 2, as compactly as possible in order to achieve a high luminance. Each light-emitting diode 3 has two terminals 4, which are respectively connected to an electrically conductive region 5. As may be seen from the detail representation in FIG. 2, the electrically conductive regions 5 serve as conductor tracks 5 for connecting the light-emitting diodes 3, which are arranged in series.

Figure 3:
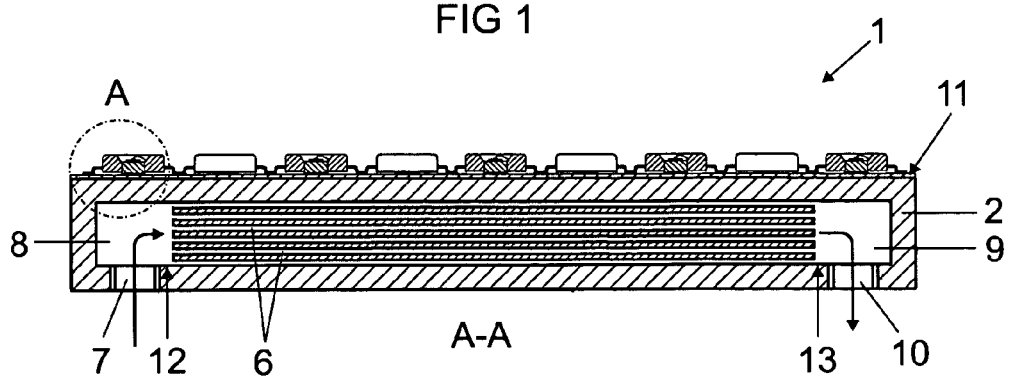
FIG. 3 shows an LED module according to the invention in a sectional representation.

FIG. 3 shows the LED module 1 according to the invention in a sectional representation, which illustrates the arrangement of the coolant channels 6. Through an inlet opening 7, the coolant, which is water in the present exemplary embodiment, enters a distributor chamber 8 and then flows through the coolant channels 6 to a collector chamber 9, from which it is discharged again through an outlet opening 10. The coolant channels 6 each have a rectangular cross section with a height (i.e. measured perpendicularly to the surface 11 on which the LEDs 3 are arranged) of 100 µm and a width of 250 µm, which corresponds to a hydraulic diameter of 143 µm$^2$. This ensures that the flow set up in the coolant channels 6 is laminar, although it may still have slight turbulence in the immediate vicinity of the inlet region 12 or the outlet region 13.

Figure 4:
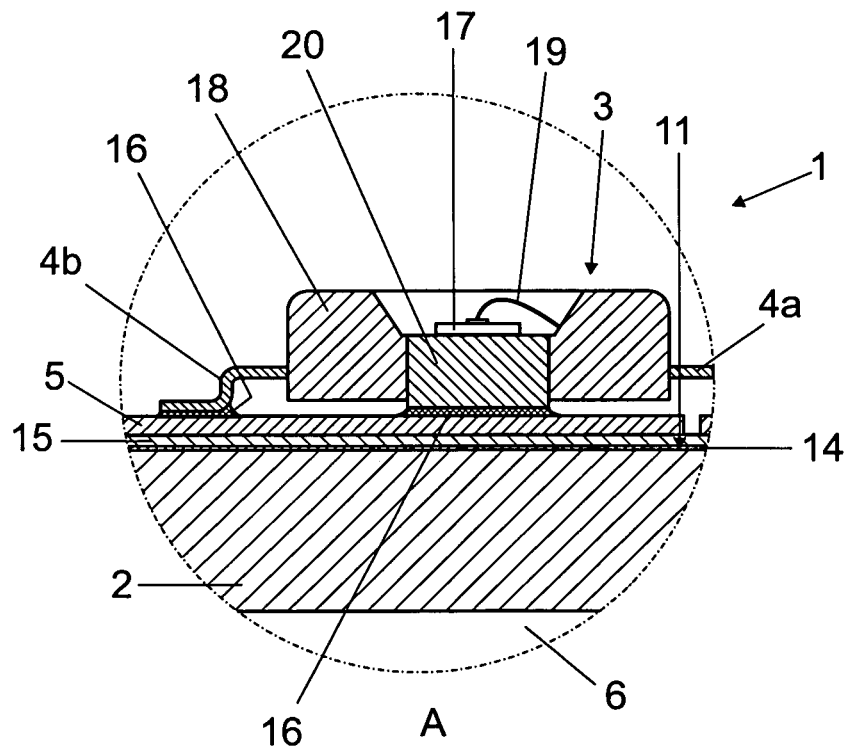
FIG. 4 shows a detail representation of an LED module according to the invention in a sectional representation.

The LEDs 3 are applied onto the surface 11 of the heat sink 2 by means of the method according to the invention, which is shown together with the resulting structure with the aid of FIG. 4:

For production of the LED module 1, the surface 11 of the heat sink 2 is first roughened by a suitable method, here blasting with corundum. An adhesion promoter layer 14 with a thickness of about 10 µm is subsequently applied by the flame spraying method. The adhesion promoter layer 14 is formed by a 95/5 composite Ni/Al powder, i.e. with a nickel proportion of 95 wt% and an aluminum proportion of 5 wt%. Other coatings may however also be envisaged, for example also of an alloy with the same composition.

On the adhesion promoter layer 14, also by the flame spraying method, an electrically insulating layer 15 of $Al_2O_3$ is applied with a thickness of approximately 100 μm. The heat sink 2 is subsequently covered with a mask according to the layout of the desired electrically conductive regions 5, and the electrically conductive layer of copper is partially applied likewise by the flame spraying method. In order to ensure an optimal solder connection of the components to the conductor tracks 5, a solder layer 16 of a tin alloy is applied onto the conductor tracks 5. To this end, a different mask is applied onto the heat sink 2 and the solder layer 16 is applied likewise by means of flame spraying. Depending on the application, it is of course also possible to use the same mask for applying the solder layer 16 as for applying the conductor tracks 5, if the latter are intended to be coated fully. The solder layer 16 may also readily be applied electrolytically, since the material is applied only onto the metal regions 5.

The LED 3, and optionally other SMD components, are subsequently applied by the reflow solder method. The LEDs 3 used are so-called packaged LEDs 3 in which the LED chip 17 per se is arranged in a package 18, where it is connected via a thin lead wire 19 to a first terminal 4a protruding from the package 18 and, via the lower side, to a so-called heat slug 20 and a second terminal 4b protruding from the package 18. Such LEDs 3 are produced and marketed for example under the brand name Golden DRAGON by Osram OPTO Semiconductors.

Of course, embodiments of the invention other than that shown in the exemplary embodiment may be envisaged.

Instead of packaged LEDs 3, for example, it is possible to use so-called unpackaged LED chips 17 which are then adhesively fastened directly onto the solder layer 16 and contacted by means of bonding.

Many options besides the thermal spraying method are also known to the person skilled in the art in respect of the coating technology for applying the individual layers 5, 14, 15, 16, for example vapor phase deposition, or electrolytic methods or the application of pastes or lacquers. Depending on the method and the requirements for the layers 5, 14, 15, 16, their thicknesses, compositions and structures may vary. Instead of $Al_2O_3$, for example, other electrically insulating materials may also be envisaged for the electrically insulating layer 15, in particular other ceramics. Materials other than pure copper may also be used for the electrically conductive regions 5, for instance brasses or bronzes. Other alloys and metals may likewise be used for the solder method, including for example gold.

The dimensions of the cooling channels 6 and their arrangement may also vary within the scope of the limits mentioned in the patent claims. A turbulent flow may also be tolerable in the region of the distributor chambers 8, 9, where large cross sections occur. Likewise, turbulence over a short distance may sometimes be unavoidable in the immediate vicinity of inlet region 12 or in the outlet region 13 of the coolant channels 6, for which reason these regions with an order of magnitude of about 0.5-5 mm should if possible not be used for the heat transfer.

The heat sink 2 may be fabricated by means of known production methods; in particular construction from individual metal foils, whose thickness advantageously corresponds to the height of the coolant channels 6, allows simple and precise fabrication of the required geometry.

The invention claimed is:

1. An LED module comprising: at least one heat sink for active cooling having at least one coolant channel through which a cooling fluid flows; an adhesion promoter layer comprising nickel and aluminum, the adhesion promoter layer being provided on a top surface of the heat sink; an electrically insulating layer provided on a top surface of the adhesion promoter layer; at least one electrically conductive layer provided on a top surface of the electrically insulating layer; and at least one light-emitting diode (LED) provided on a top surface of the electrically conductive layer; wherein dimensions of the at least one coolant channel are such that a predominantly laminar flow of the cooling fluid is obtained in the at least one coolant channel during operation of the LED module; wherein a nickel content of the adhesion promoter layer is between 85% and 95%, inclusive.

2. The LED module as claimed in claim 1, wherein the at least one coolant channel has a width of between 100 μm and 400.

3. The LED module as claimed in claim 1 or 2, wherein the at least one coolant channel has a height of between 25 μm and 175 μm.

4. The LED module as claimed in claim 1, wherein the at least one coolant channel has a hydraulic diameter of between 70 μm and 250 μm.

5. The LED module as claimed in claim 1, wherein the cooling fluid is a medium that is liquid at room temperature.

6. The LED module as claimed in claim 1, wherein the at least one LED is arranged directly on the heat sink, the heat sink being coated or uncoated.

7. The LED module as claimed in claim 1, wherein the electrically insulating layer comprises at least one of a metal oxide and a ceramic material.

8. The LED module as claimed in claim 1, wherein the electrically conductive layer comprises at least one conductor track.

9. The LED module as claimed in claim 8, wherein at least one solder layer is arranged between the electrically conductive layer and the LED.

10. A method for producing the LED module of claim 1, the method comprising:
roughening the top surface of the heat sink;
applying the adhesion promoter layer onto at least some of the roughened surface;
applying the electrically insulating layer onto at least some of the adhesion promoter layer; and
applying electrical components.

11. The method as claimed in claim 10, further comprising applying a solder layer onto at least some of the electrically conductive layer.

12. The method as claimed in claim 10, wherein the electrical components are applied by a reflow solder process.

13. The method as claimed in claim 10, wherein the electrical components are adhesively fastened and contacted by bonding.

14. The method as claimed in claim 10, wherein at least one of the layers is applied by a thermal spraying method.

15. The LED module as claimed in claim 1, wherein the at least one coolant channel has a width of between 200 μm and 300 μm.

16. The LED module as claimed in claim 1 or 15, wherein the at least one coolant channel has a height of between 50 μm and 120 μm.

17. The LED module as claimed in claim 5, wherein the cooling fluid is water.

18. The method as claimed in claim 10, wherein the electrical components comprise light-emitting diodes.

19. The method as claimed in claim 10, wherein the electrical components are one of: (i) applied by a reflow solder process, and (ii) adhesively fastened and contacted by bonding.

* * * * *